United States Patent
Sasaki et al.

(10) Patent No.: US 10,549,305 B2
(45) Date of Patent: Feb. 4, 2020

(54) SUPPORT STRUCTURE FOR SUSPENDED INJECTOR AND SUBSTRATE PROCESSING APPARATUS USING SAME

(71) Applicant: TOKYO ELECTRON LIMITED, Tokyo (JP)

(72) Inventors: Yuya Sasaki, Iwate (JP); Kiichi Takahashi, Iwate (JP); Yasushi Takeuchi, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 162 days.

(21) Appl. No.: 15/685,375

(22) Filed: Aug. 24, 2017

(65) Prior Publication Data
US 2018/0056317 A1 Mar. 1, 2018

(30) Foreign Application Priority Data
Aug. 29, 2016 (JP) ................................ 2016-166713

(51) Int. Cl.
*B05B 15/60* (2018.01)
*B05B 15/62* (2018.01)
*C23C 16/455* (2006.01)
*B05B 1/20* (2006.01)
*B05B 1/00* (2006.01)

(52) U.S. Cl.
CPC ................ *B05B 15/62* (2018.02); *B05B 1/20* (2013.01); *C23C 16/45565* (2013.01); *B05B 1/005* (2013.01); *Y10T 29/49778* (2015.01)

(58) Field of Classification Search
CPC .......... B05B 15/62; B05B 1/20; B05B 1/005; C23C 16/45563; C23C 16/45565; H01L 21/67011; H01J 37/3244; H01J 37/32568; Y10T 29/49778
See application file for complete search history.

(56) References Cited

U.S. PATENT DOCUMENTS

| | | | | |
|---|---|---|---|---|
| 5,516,159 A | * | 5/1996 | Hirakawa | ............ F16L 19/0212 285/148.11 |
| 2009/0091125 A1 | * | 4/2009 | Takeda | .................... B25B 27/10 285/88 |

(Continued)

FOREIGN PATENT DOCUMENTS

JP 2015-151574 A 8/2015

*Primary Examiner* — Matthew J Song
(74) *Attorney, Agent, or Firm* — Nath, Goldberg & Meyer; Jerald L. Meyer

(57) ABSTRACT

A support structure for a suspended injector includes a suspended injector having a tubular vertical portion extending in a vertical direction, one or more chamfered portions formed by chamfering an outer peripheral surface near an upper end of the tubular vertical portion, a pair of holding members each having a flat surface formed on an inner peripheral surface of each of the pair of holding members to engage with each of the chamfered portions, each of the pair of holding members holding the tubular vertical portion of the suspended injector by sandwiching the tubular vertical portion of the suspended injector from both sides each of the pair of holding members, and a support structure part configured to fixedly support the pair of holding members, and configured to suspend and support the suspended injector.

14 Claims, 6 Drawing Sheets

(56) References Cited

U.S. PATENT DOCUMENTS

| | | | |
|---|---|---|---|
| 2009/0165279 A1* | 7/2009 | Bockemehl, Jr. | ............................ C23C 16/45565 29/428 |
| 2009/0260571 A1* | 10/2009 | Ostrowski | ......... C23C 16/45565 118/728 |
| 2010/0288439 A1* | 11/2010 | Ishibashi | ........... C23C 16/45565 156/345.33 |
| 2012/0037503 A1* | 2/2012 | Lippert | ............... C23C 14/3407 204/298.28 |

* cited by examiner

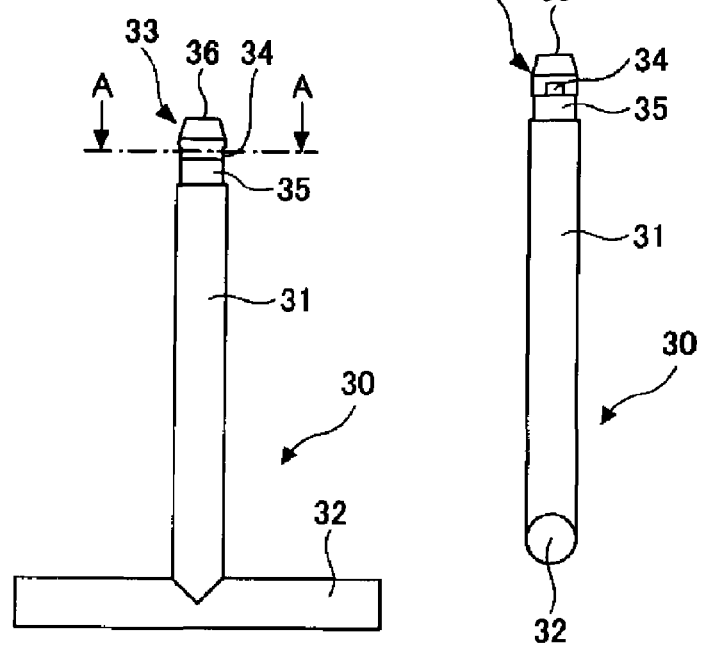

SUPPORT STRUCTURE FOR SUSPENDED INJECTOR AND SUBSTRATE PROCESSING APPARATUS USING SAME

CROSS-REFERENCE TO RELATED APPLICATION

This application is based upon and claims the benefit of priority from Japanese Patent Application No. 2016-166713, filed Aug. 29, 2016, the entire contents of which are incorporated herein by reference.

TECHNICAL FIELD

The present disclosure relates to a support structure for a suspended injector and a substrate processing apparatus using the same.

BACKGROUND

Conventionally, there is known an injector holding structure which includes a metal port into which a tip of an injector can be inserted, a tapered ring having a predetermined tapered surface and fitted over the injector, and a nut fitted over the injector and having a tapered opening engaging with the predetermined tapered surface of the tapered ring, the nut locked to the metal port in a state in which the nut covers the tapered surface of the tapered ring. The injector holding structure is capable of securely holding the injector and improving the sealing performance.

However, the injector holding structure described above has a configuration in which the metal port is horizontally provided and the injector is horizontally inserted.

The injector holding structure varies depending on the process contents of a substrate processing process performed using the injector and the structure of a substrate processing apparatus. For example, when it is desired to introduce the injector to suspend from the upper surface of a processing chamber, the configuration described above is not necessarily a preferable configuration. In other words, when the injector is introduced to suspend from the upper surface of the processing chamber, it is important to adopt a support structure that prevents the injector from falling down.

SUMMARY

Some embodiments of the present disclosure provide a support structure for a suspended injector capable of preventing a suspended injector from falling down and a substrate processing apparatus using the same.

According to one embodiment of the present disclosure, there is provided a support structure for a suspended injector, including: a suspended injector having a tubular vertical portion extending in a vertical direction; one or more chamfered portions formed by chamfering an outer peripheral surface near an upper end of the tubular vertical portion; a pair of holding members each having a flat surface formed on an inner peripheral surface of each of the pair of holding members to engage with each of the chamfered portions, each of the pair of holding members holding the tubular vertical portion of the suspended injector by sandwiching the tubular vertical portion of the suspended injector from both sides each of the pair of holding members; and a support structure part configured to fixedly support the pair of holding members, and configured to suspend and support the suspended injector.

According to one embodiment of the present disclosure, there is provided a substrate processing apparatus, including: a processing chamber; and the support structure for a suspended injector described above installed on an upper surface of the processing chamber, wherein the suspended injector of the support structure for a suspended injector is introduced into the processing chamber from the upper surface.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 2A to 2E are views showing an example of a suspended injector according to an embodiment of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
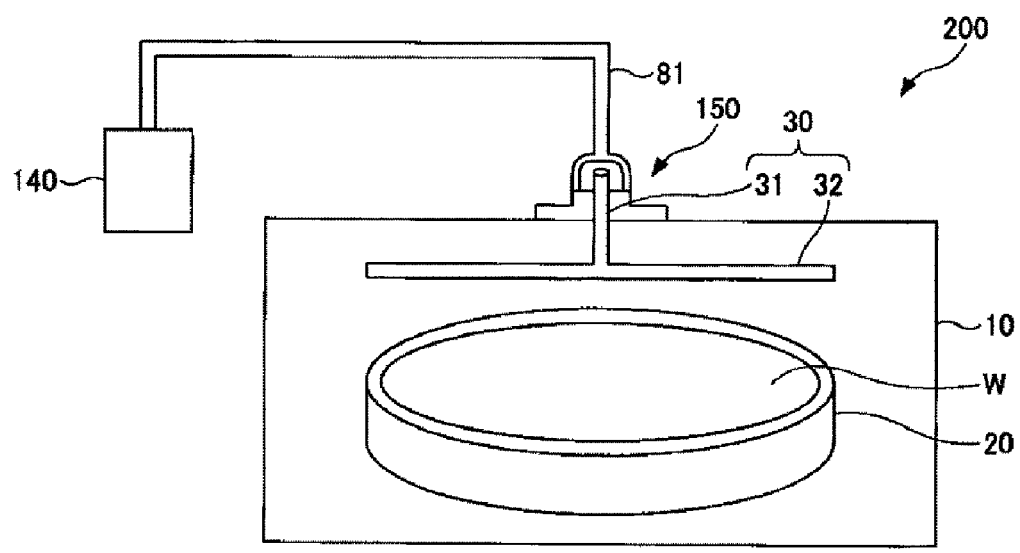
FIG. 1 is a view showing an example of a support structure for a suspended injector according to an embodiment of the present disclosure and an example of a substrate processing apparatus using the same.

FIG. 1 is a view showing an example of a support structure 150 for a suspended injector according to an embodiment of the present disclosure and an example of a substrate processing apparatus 200 using the same.

Referring to FIG. 1, the substrate processing apparatus 200 includes a processing chamber 10, a substrate support 20, a suspended injector 30, a suspended injector support structure 150, a gas introduction pipe 81, and a gas supply source 140. A wafer W to be processed is mounted on the surface of the substrate support 20.

The processing chamber 10 is a processing container for performing a predetermined substrate processing process therein. The processing chamber 10 accommodates a substrate such as a wafer W or the like therein and performs a predetermined process on the substrate.

The substrate support 20 is a mounting table for mounting a wafer W, which is provided in the processing chamber 10. In a state in which the wafer W is mounted on the substrate support 20, a predetermined substrate processing process is performed on the wafer W. The substrate support 20 may have a rotating function, if necessary. In FIG. 1, one wafer W is mounted on the substrate support 20. However, for example, a plurality of wafers W may be mounted along the circumferential direction of the substrate support 20.

The suspended injector 30 is an injector installed so as to be hung from above. Generally, many injectors are introduced into the processing chamber 10 from the outer side surface of the processing chamber 10. However, in the present embodiment, the suspended injector 30 is used. In the case of the suspended injector 30, a vertical portion 31 of the suspended injector 30 is suspended from the upper surface of the processing chamber 10 and held in place. The suspended injector 30 may be configured to have different shapes. As shown in FIG. 1, the suspended injector 30 may have a configuration in which a horizontal portion 32 extending parallel to the surface of the wafer W is provided and a process gas is uniformly supplied from the horizontal portion 32 to the surface of the wafer W. Although not shown in FIG. 1, a plurality of discharge holes for discharging a fluid such as process gas or the like may be provided at predetermined intervals on the bottom surface of the horizontal portion 32 so that a process gas or the like can be supplied to the surface of the wafer W.

The suspended injector support structure 150 is a support structure for suspending and supporting the suspended injector 30. The suspended injector support structure 150 has a structure for preventing the suspended injector 30 from falling down. The details thereof will be described later.

The gas introduction pipe 81 is an introduction pipe for supplying the process gas supplied from the gas supply source 140 to the suspended injector 30. The gas supply source 140 is a supply source of the process gas. The gas introduction pipe 81 connects the gas supply source 140 and the suspended injector 30. The gas introduction pipe 81 supplies the process gas stored in the gas supply source 140 to the suspended injector 30.

FIGS. 2A to 2E are views showing an example of the suspended injector according to the embodiment of the present disclosure. The suspended injector 30 is not limited to the one having a T-shape. In the present embodiment, the description will be given by taking the T-shaped suspended injector 30 as an example.

Figure 2C:
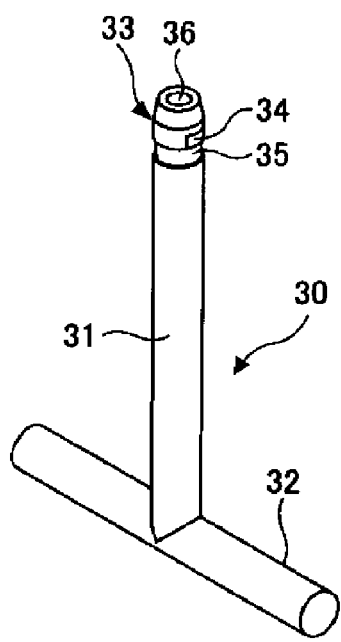
Figure 2D:
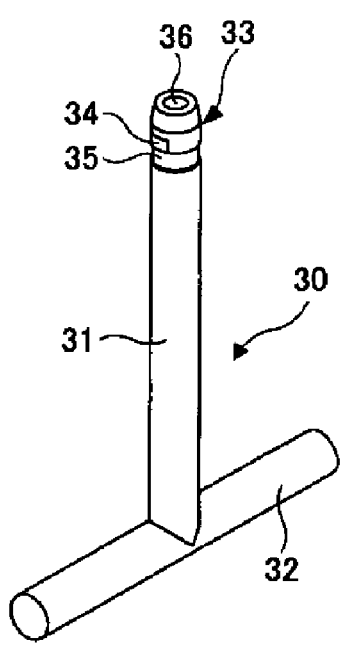
Figure 2E:
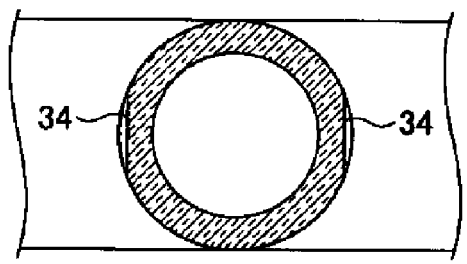

FIG. 2A is a front view of the suspended injector 30 according to the present embodiment, and FIG. 2B is a side view of the suspended injector 30 according to the present embodiment. FIG. 2C is a perspective view of the suspended injector 30 according to the present embodiment as seen from the right side of the suspended injector 30, and FIG. 2D is a perspective view of the suspended injector 30 according to the present embodiment as seen from the left side of the suspended injector 30. FIG. 2E is a sectional view taken along the line A-A in FIG. 2A.

As shown in FIGS. 2A to 2D, the suspended injector 30 includes a vertical portion 31 and a horizontal portion 32. The vertical portion 31 is a vertically extending portion, and the horizontal portion 32 is a horizontally extending portion. As described with reference to FIG. 1, the vertical portion 31 serves as a process gas introduction portion and the horizontal portion 32 serves as a process gas supply portion.

Chamfered portions 34 are provided slightly below the upper end of an upper end portion 33 of the vertical portion 31. A recessed surface 35 is provided just under the chamfered portions 34. The chamfered portions 34 are portions in which the outer peripheral surface of the vertical portion 31 is partially chamfered to form flat surfaces. As shown in FIGS. 2A, 2C, 2D and 2E, the chamfered portions 34 are provided in a pair on the opposite surfaces of the outer peripheral surface of the vertical portion 31. The chamfered portions 34 are also used for aligning the horizontal portion 32. In FIG. 2, there is shown an example in which the extension direction of the horizontal portion 32 coincides with the direction in which the chamfered portions 34 are provided. The chamfered portions 34 form a part of a fixed support structure. The details thereof will be described later.

Although the chamfered portions 34 are formed in a pair in consideration of the ease of machining, the function thereof can be sufficiently obtained even if a chamfered portion is provided at one location. In that case, the upper end portion 33 shown in FIG. 2E has a substantially D-like shape.

The recessed surface 35 is a region obtained by cutting the circumferential surface of the upper end portion 33 of the vertical portion 31 in a band shape with a constant depth along the circumferential direction. As shown in FIG. 2A, the depths of the recesses of the chamfered portions 34 and the recessed surface 35 are set at the same depth. It is also possible to make the surfaces of the chamfered portions 34 and the recessed surface 35 coplanar. The surfaces of the chamfered portions 34 and the recessed surface 35 may be freely set depending on the application. However, the configuration of the fixed support structure becomes easier if the surfaces of the chamfered portions 34 and the recessed surface 35 are coplanar. This will also be described later.

As shown in FIGS. 2C to 2E, an opening is formed at the upper end 36 of the vertical portion 31. Since the suspended injector 30 has a tubular shape, the opening is naturally formed at the upper end. Further, the portion just below the upper end 36 is tapered. If the portion just below the upper end 36 is formed in a tapered shape, it is easier to perform an insertion work or the like. However, the disclosure is not limited thereto. The portion just below the upper end 36 may have various shapes depending on the application.

The suspended injector 30 may be made of, for example, quartz, although the material thereof is not limited. Quartz has a high heat retention property and can supply a process gas in a state in which the process gas is kept at a high temperature. Therefore, the suspended injector 30 may be made of quartz.

Figure 3:
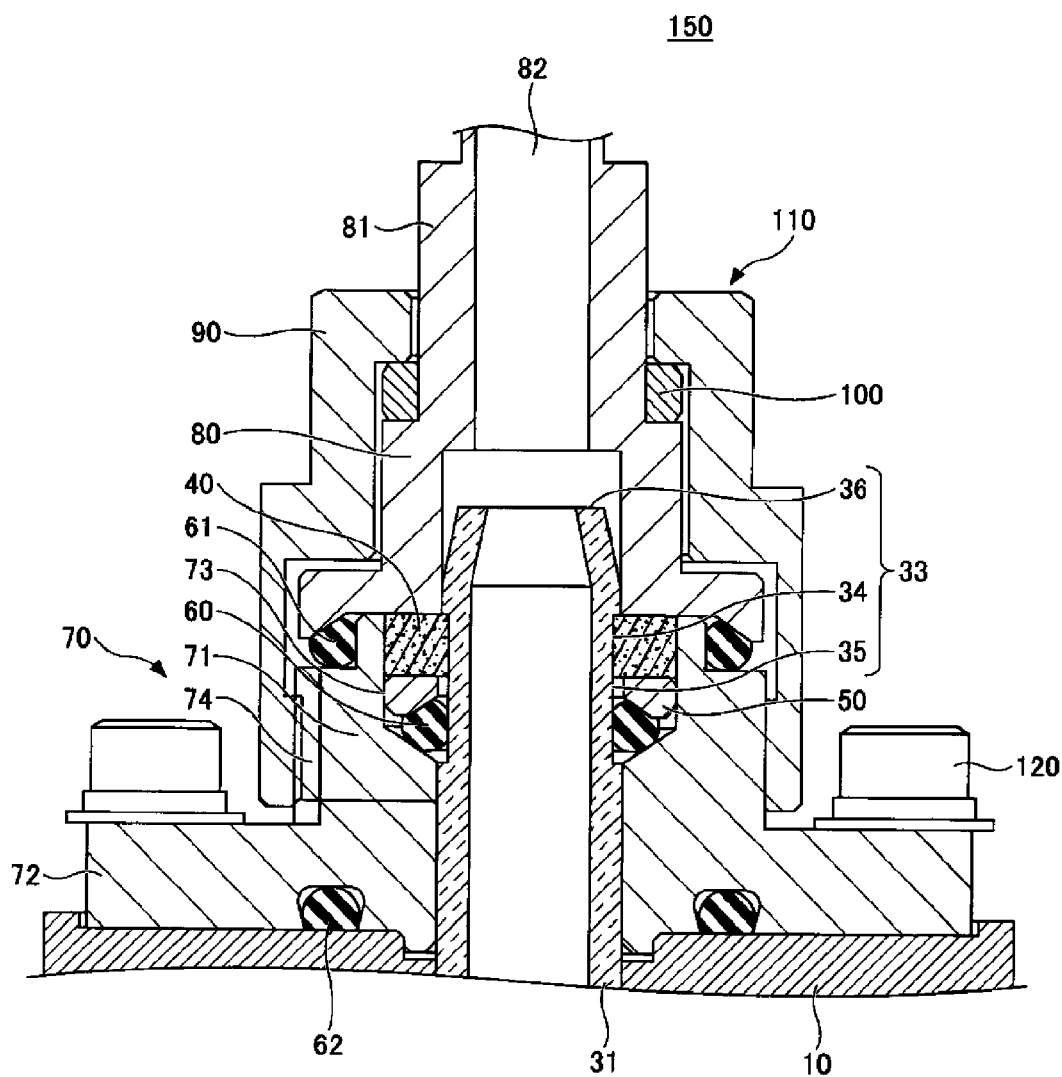
FIG. 3 is a sectional view showing an example of a support structure for a suspended injector according to an embodiment of the present disclosure.
Figure 4:
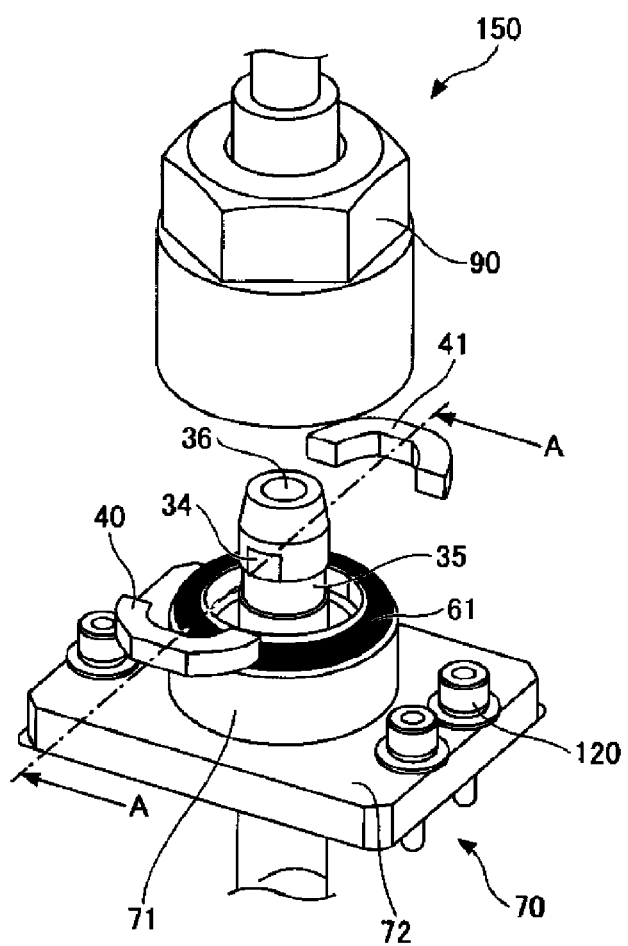
FIG. 4 is an exploded perspective view showing an example of a support structure for a suspended injector according to an embodiment of the present disclosure.

FIG. 3 is a sectional view showing an example of a support structure of a suspended injector according to an embodiment of the present disclosure. FIG. 4 is a perspective view showing an example of a support structure of a suspended injector according to an embodiment of the present disclosure. FIG. 3 is a sectional view taken along the line A-A in FIG. 4.

As shown in FIG. 3, the support structure 150 of the suspended injector 30 according to the present embodiment includes a vertical portion 31 of the suspended injector 30, spacers 40, a sleeve 50, O-rings 60 to 62, an injector port 70, a pressing member 80, a nut 90, a co-rotation prevention ring 100, and a screw 120.

The spacers 40 are provided around the chamfered portions 34 of the upper end portion 33 of the suspended injector 30. The spacers 40 engage with the chamfered portions 34 and function as holding members for holding the suspended injector 30. As shown in FIG. 4, the spacers 40 are configured as a pair of holding members each having a flat surface 41 formed on the inner peripheral surface thereof so as to engage with each of the chamfered portions 34. Two spacers 40 having a substantially C-like shape or a substantially U-like shape are configured to sandwich the pair of chamfered portions 34 from both sides. The chamfered portions 34 and the flat surfaces 41 are engaged to hold the vertical portion 31 of the suspended injector 30. Therefore, the inner peripheral surfaces of the spacers 40 have a shape conforming to the chamfered portions 34 and the outer peripheral surface around the chamfered portions 34. Since the chamfered portions 34 and the flat surfaces 41 are engaged with each other, the spacers 40 can fix the orientation of the suspended injector 30. In this manner, the spacers 40 hold the vertical portion 31 while positioning the suspended injector 30.

The chamfered portions 34 and the outer peripheral surface other than the chamfered portions 34 create a step difference. Therefore, by allowing the spacers 40 to engage with the chamfered portions 34 and to sandwich the chamfered portions 34, as shown in FIG. 3, the step difference locations can surely prevent the suspended injector 30 from falling down. In other words, the neck-like portion in the vicinity of the upper end 36 of the vertical portion 31 of the suspended injector 30 is caught on the upper surfaces of the spacers 40. This makes it possible to prevent the suspended injector 30 from falling down and to surely suspend and support the suspended injector 30.

As described above, the chamfered portions 34 are not necessarily provided as a pair of opposite surfaces. Even if there is provided only one chamfered portion, it is possible to achieve the function of preventing the injector 30 from falling down through the use of a step difference. Therefore, one or more chamfered portions 34 may be provided. Depending on the application, it is possible to provide different numbers of chamfered portions 34 at different positions.

It is preferable that the spacers 40 are made of a material which is soft and does not damage the suspended injector 30. For example, the spacers 40 may be made of a resin. Since the spacers 40 make direct contact with the suspended injector 30, it is preferable that the spacers 40 are made of a soft material. Particularly, when the suspended injector 30 is made of quartz, it is preferable that the spacers 40 are made of a soft material such as a resin or the like. Among resins, for example, a fluorocarbon resin or the like can be suitably used.

The sleeve 50 is a member that supports the bottom surfaces of the spacers 40. Therefore, the sleeve 50 is provided under the spacers 40 and is provided so as to support the spacers 40 by coming into contact with the bottom surfaces of the spacers 40. The sleeve 50 may be made of, for example, a metal such as aluminum or the like.

The O-ring 60 is a member for elastically supporting the spacers 40 via the sleeve 50. The O-ring 60 is provided on the bottom surface of a recessed portion 73 of the injector port 70 and is configured to make contact with three points, i.e., the bottom surface of the recessed portion 73, the recessed surface 35 of the suspended injector 30 and the bottom surface of the sleeve 50. This enables the O-ring 60 to elastically support all of the three points from below.

The injector port 70 is a port for introducing the suspended injector 30 into the processing chamber 10 and has a function as a base in the support structure 150 of the suspended injector 30. The injector port 70 includes a side surface portion 71, a base portion 72, a recessed portion 73, and a thread coupling portion 74. The side surface portion 71 constitutes a part of the support structure part 110 of the support structure 150 of the suspended injector 30 and accommodates the spacers 40, the sleeve 50 and the O-ring 60 in the recessed portion 73. That is, the side surface portion 71 supports the support structure part 110 formed of these parts from below. The upper surface of the side surface portion 71 is flush with the upper surfaces of the spacers 40. The pressing member 80 presses the upper surface of the side surface portion 71 and the upper surfaces of the spacers 40 from above until the upper surface of the side surface portion 71 becomes flush with the upper surfaces of the spacers 40. An O-ring 61 is provided in the upper end portion of the side surface portion 71, thereby sealing the side surface portion 71 so that the atmosphere does not to enter the processing chamber 10.

Further, the injector port 70 includes a thread coupling portion 74 under the side surface portion 71. The thread coupling portion 74 is a portion on which a thread is formed. As the thread coupling portion 74 is threadedly coupled with the nut 90, a pressing force is applied to the pressing member 80 from above. That is, by rotating the nut 90, the thread coupling portion 74 of the injector port 70 and the nut 90 are threadedly coupled with each other. The nut 90 is moved down, whereby a pressing force is applied from the nut 90 to the pressing member 80.

The base portion 72 of the injector port 70 is a portion installed on the upper surface of the processing chamber 10. An O-ring 62 is provided on the lower surface of the base portion 72. The O-ring 62 is provided to seal the base portion 72 so that the atmosphere does not enter the processing chamber 10 from between the lower surface of the injector port 70 and the upper surface of the processing chamber 10.

As described above, the pressing member 80 is a member for pressing the spacers 40 and the injector port 70. The pressing member 80 is a lower end portion of the gas introduction pipe 81. The pressing member 80 connects the gas introduction pipe 81 to the upper end 36 of the suspended injector 30. In order to hold the vertical portion 31 of the suspended injector 30 via the spacers 40, the pressing member 80 presses the upper surfaces of the spacers 40 and the injector port 70 with the lower surface thereof. A flow path 82 is formed inside the gas introduction pipe 81.

As described above, the nut 90 is threadedly coupled with the thread coupling portion 74 in the lower end portion of the side surface of the injector port 70. As the nut 90 is moved down, the nut 90 presses the upper surface of the internally engaged pressing member. The nut 90 plays a role of applying a pressing force to the spacers 40 and the like.

The co-rotation prevention ring 100 has a function of preventing co-rotation of the nut 90 with the gas introduction pipe 81 and the pressing member 80.

Since the nut 90, the pressing member 80 and the injector port 70 fixedly support and sandwich the spacer 40 from above and below, they may be referred to as a support structure part 110. The nut 90, the pressing member 80 and the injector port 70 cooperate as a whole to press the spacers 40 from above and below, thereby supporting the suspended injector 30.

Screws 120 are a fixing means for fixing the base portion 72 of the injector port 70 to the upper surface or the like of the processing chamber 10.

As shown in FIG. 4, in order to support the suspended injector 30, the suspended injector 30 is firstly temporarily pulled upward. The chamfered portions 34 are sandwiched and supported by the spacers 40 from both sides thereof. The spacers 40 are accommodated in the recessed portion 73. The nut 90 is covered from above and is threadedly coupled and pressed, thereby suspending and supporting the suspended injector 30. As a result, it is possible to prevent the suspended injector 30 from falling down and to reliably support the suspended injector 30 in a suspended state.

In FIG. 4, there are shown screws 120 for fixing the base portion 72 of the injector port. In this way, the injector port 70 may be fixed to the upper surface of the processing chamber 10 with a plurality of screws (three screws in FIG. 4).

In addition, the injector port 70 may be formed integrally with the processing chamber 10 to which the injector is attached. In this case, the screws 120 and the O-ring 62 are omitted.

Figure 5:
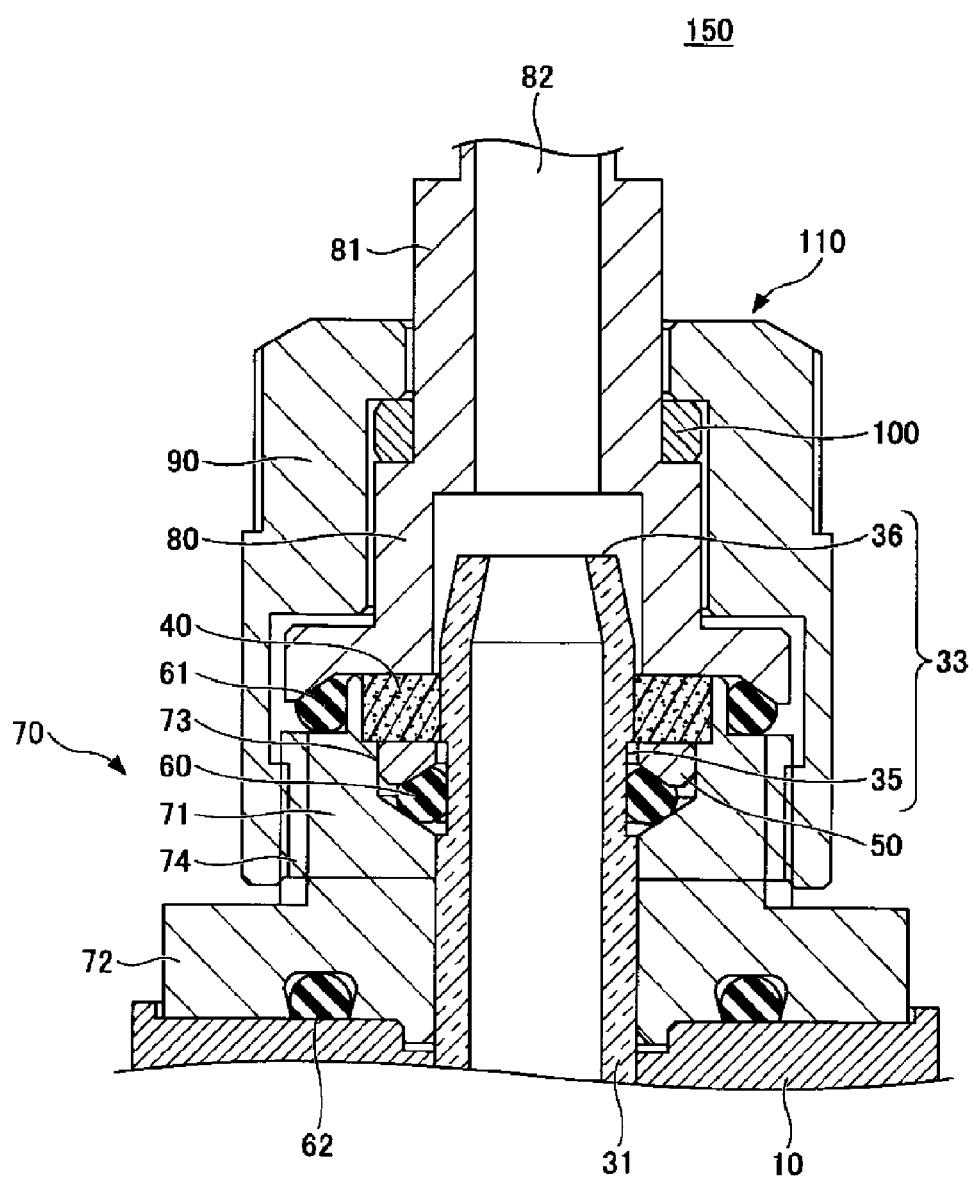
FIG. 5 is a side sectional view showing an example of a support structure for a suspended injector according to an embodiment of the present disclosure.

FIG. 5 is a sectional view taken along a plane perpendicular to FIG. 3 and showing an example of a support structure of a suspended injector according to an embodiment of the present disclosure. In FIG. 5, the constituent elements are the same as those explained with reference to FIGS. 3 and 4. Therefore, the same constituent elements are denoted by like reference numerals, and description thereof is omitted.

In FIG. 5, there is shown a portion in which the chamfered portions 34 forms a step difference with a depth different from that of the recessed surface 35. As compared with FIG. 3, the recessed surface 35 has the same depth over the entire circumference, the chamfered portions 34 are deepened only at the chamfered locations, and a catching structure like a neck is formed in the upper portion of the chamfered portions 34 (FIG. 3). In contrast, the area not chamfered is raised and a catching structure is not formed (FIG. 5).

As described above, according to the support structure for the suspended injector and the substrate processing apparatus according to the embodiment of the present disclosure, it is possible to reliably prevent the suspended injector 30 from falling down and to support the suspended injector 30 with the minimum chamfering.

Further, in the present embodiment, the suspended injector 30 is configured to include the horizontal portion 32. However, the suspended injector 30 may be formed of only the vertical portion 31 or may be configured to include an L-shaped horizontal portion 32. As long as the suspended injector 30 includes the supporting-purpose vertical portion 31, the lower structure thereof may be variously configured depending on the application. For example, when the present disclosure is applied to a vertical heat treatment apparatus, it may be possible to adopt a configuration in which the suspended injector 30 having only the vertical portion 31 is suspended and supported.

According to the present disclosure in some embodiments, it is possible to prevent a suspended injector from falling down and to securely fix and support the suspended injector.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A support structure for a suspended injector, comprising:
    a suspended injector having a tubular vertical portion extending in a vertical direction;
    one or more chamfered portions formed by chamfering an outer peripheral surface near an upper end of the tubular vertical portion;
    a pair of holding members each having a flat surface formed on an inner peripheral surface of each of the pair of holding members to engage with each of the chamfered portions, each of the pair of holding members holding the tubular vertical portion of the suspended injector between each of the pair of holding members from both sides of the tubular vertical portion; and
    a support structure part configured to fixedly support the pair of holding members from above and below the pair of holding members, and configured to suspend and support the suspended injector,
    wherein the support structure part includes:
        a base portion including a recess that accommodates the pair of holding members; and
        a pressing member configured to press upper surfaces of the pair of holding members and an upper surface of the base portion.

2. The support structure of claim 1, wherein the suspended injector is made of quartz and the pair of holding members is made of a resin.

3. The support structure of claim 2, wherein the resin is a fluorocarbon resin.

4. The support structure of claim 1, wherein the support structure part further includes an elastic member configured to elastically support lower surfaces of the pair of holding members via a sleeve.

5. The support structure of claim 4, wherein the base portion further includes a through-hole through which the tubular vertical portion of the suspended injector is penetrated, and
    wherein the recess is formed in an upper end portion of the through-hole so as to accommodate the elastic member, the sleeve and the pair of holding members.

6. The support structure of claim 5, wherein the tubular vertical portion of the suspended injector includes a band-like recessed surface disposed below the chamfered portions and formed by cutting the entire periphery to the same surface as the chamfered portions, and
    the elastic member is an O-ring and is provided so as to make contact with a bottom surface of the recess, the band-like recessed surface and a lower surface of the sleeve.

7. The support structure of claim 6, wherein the pressing member is a lower end portion of a fluid introduction pipe and is configured to cover an upper end of the suspended injector held by the pair of holding members and to communicate with the suspended injector.

8. The support structure of claim 7, further comprising:
    a nut member configured to cover at least an upper surface and a side surface of the pressing member and a side surface of the base portion, the fluid introduction pipe to passing through the nut member,
    wherein the nut member is threadedly coupled with the side surface of the base portion to press the pressing member.

9. The support structure of claim 8, wherein a seal member is provided between the pressing member and the base portion.

10. The support structure of claim 9, wherein a seal member is provided on a lower surface of the base portion, and the base portion is air-tightly mounted on an upper surface of a processing chamber.

11. The support structure of claim 1, wherein the suspended injector has a T shape or an L shape having a horizontally extending portion under the tubular vertical portion, and an engagement between the chamfered portions of the tubular vertical portion and the pair of holding members positions the T shape or the L shape.

12. The support structure of claim 1, wherein the suspended injector as a whole is configured as the tubular vertical portion.

13. The support structure of claim 1, wherein the chamfered portions are formed in a pair on opposite surfaces of the outer peripheral surface of the suspended injector.

14. A substrate processing apparatus, comprising:
a processing chamber; and
the support structure of claim 1 installed on an upper surface of the processing chamber,
wherein the suspended injector of the support structure is introduced into the processing chamber from the upper surface.

* * * * *